United States Patent
Huang et al.

(10) Patent No.: US 9,898,645 B2
(45) Date of Patent: Feb. 20, 2018

(54) FINGERPRINT SENSOR DEVICE AND METHOD

(71) Applicant: Taiwan Semiconductor Manufacturing Company, Ltd., Hsin-Chu (TW)

(72) Inventors: Yu-Chih Huang, Hsin-Chu (TW); Chih-Hua Chen, Zhubei (TW); Yu-Jen Cheng, New Taipei (TW); Chih-Wei Lin, Zhubei (TW); Yu-Feng Chen, Hsin-Chu (TW); Hao-Yi Tsai, Hsin-Chu (TW); Chung-Shi Liu, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/053,357

(22) Filed: Feb. 25, 2016

(65) Prior Publication Data

US 2017/0140202 A1 May 18, 2017

Related U.S. Application Data

(60) Provisional application No. 62/256,237, filed on Nov. 17, 2015.

(51) Int. Cl.
*H01L 21/28* (2006.01)
*G06K 9/00* (2006.01)
*H01L 21/56* (2006.01)
*H01L 23/498* (2006.01)

(52) U.S. Cl.
CPC ........ *G06K 9/00053* (2013.01); *H01L 21/561* (2013.01); *H01L 23/49827* (2013.01); *H01L 2224/18* (2013.01); *H01L 2224/48091* (2013.01); *H01L 2224/73204* (2013.01)

(58) Field of Classification Search
CPC ............ G06K 9/00013; H01L 25/0652; H01L 2225/06555; H01L 25/0657; H01L 25/50; H01L 2225/06541; H01L 2924/0002; H01L 2225/06565; H01L 2924/00; H01L 2224/94; H01L 2224/321; H01L 27/14636; H01L 2924/1461; H01L 21/76898; H01L 23/481; H01L 23/49827; H01L 23/5226
See application file for complete search history.

(56) References Cited

U.S. PATENT DOCUMENTS

| 7,424,136 B2 | 9/2008 | Setlak et al. |
| 8,361,842 B2 | 1/2013 | Yu et al. |
| 8,476,727 B2 | 7/2013 | Tian et al. |

(Continued)

FOREIGN PATENT DOCUMENTS

| CN | 101379510 A | 3/2009 |
| TW | 201428639 A | 7/2014 |

*Primary Examiner* — Roy Potter
(74) *Attorney, Agent, or Firm* — Slater Matsil, LLP

(57) ABSTRACT

A fingerprint sensor package and method are provided. Embodiments include a sensor and a sensor surface material encapsulated within the fingerprint sensor package. An array of electrodes of the sensor are electrically connected using through vias that are located either in the sensor, in connection blocks separated from the sensor, or through connection blocks, or else connected through other connections such as wire bonds. A high voltage die is attached in order to increase the sensitivity of the fingerprint sensor.

20 Claims, 15 Drawing Sheets

(56) References Cited

U.S. PATENT DOCUMENTS

| | | |
|---|---|---|
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 2011/0291288 A1 | 12/2011 | Wu et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0103943 A1 | 4/2014 | Dunlap et al. |
| 2014/0138788 A1 | 5/2014 | Kim et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |

FINGERPRINT SENSOR DEVICE AND METHOD

This application claims priority to and the benefit of U.S. Provisional Application No. 62/256,237, filed on Nov. 17, 2015, entitled "Low Cost Interconnect of Fingerprint Sensor Chip in INFO Structure," which application is hereby incorporated herein by reference in its entirety.

BACKGROUND

As user devices become smaller and more portable, it has become easier for people with ill intentions to steal user devices. When such devices bear sensitive information of the user, thieves may be able to access such information unless barriers have been placed into the user device. Once such barrier is a fingerprint sensor which can be used to read the fingerprint of the person attempting to access the device and, if the fingerprint is not the same fingerprint of the user, access may be denied.

However, as user devices such as cell phones become smaller, there is a pressure on each of the individual components within the user device to also see a concurrent reduction in size. As such, there is a pressure to reduce the size of the fingerprint package that contains the fingerprint sensor without seeing a reduction in performance. As such, improvements are needed to see the desired reduction in size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
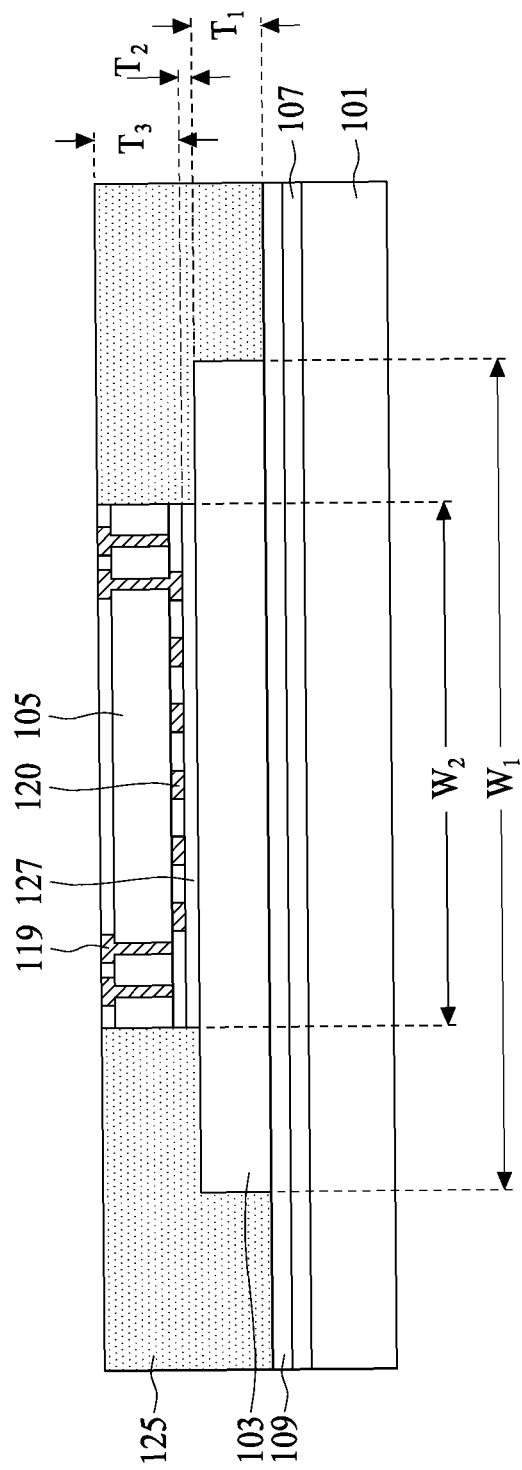
FIGS. 1A-1E illustrate a fingerprint sensor package which uses through vias located within a sensor in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a fingerprint sensor in a system in package solution or else an integrated fan out (InFO) structure. However, embodiments may be used in any suitable package.

With reference now to FIG. 1A, there is illustrated a carrier substrate 101 to which a sensor surface material 103 and a sensor 105 are attached. The carrier substrate 101 comprises, for example, silicon based materials, such as glass or silicon oxide, or other materials, such as aluminum oxide, combinations of any of these materials, or the like. The carrier substrate 101 is planar in order to accommodate an attachment of devices such as the sensor surface material 103 and the sensor 105.

To help secure the sensor surface material 103 to the carrier substrate 101, a protective layer 107 and an adhesive layer 109 may be placed onto the carrier substrate 101 prior to the placement of the sensor surface material 103. In an embodiment the protective layer 107 may be a light-to-heat conversion (LTHC) layer, although any suitable material may be utilized. The protective layer 107 may be dispensed as a liquid and cured, may be a laminate film laminated onto the carrier substrate 101, or the like, depending upon the material chosen.

The adhesive layer 109 may be placed over the protective layer 107 in order to assist in the attachment of the sensor surface material 103 to the carrier substrate 101. In an embodiment the adhesive layer 109 is a die attached film (DAF), such as an epoxy resin, a phenol resin, acrylic rubber, silica filler, or a combination thereof, and is applied using a lamination technique. However, any other suitable material and method of formation may be utilized.

The sensor surface material 103 is placed in contact with the adhesive layer 109 and is used to separate the sensor 105 from an overlying finger (not separately illustrated in FIG. 1A). In an embodiment the sensor surface material 103 is a material such as sapphire or glass that allows for the measurement of capacitive changes between the sensor 105 and an overlying finger to determine contours of a fingerprint on the finger. In an embodiment the sensor surface material 103 may have a first width $W_1$ of between about 5 mm and about 15 mm, such as about 10 mm, and may be placed using a physical placing process. Additionally, the sensor surface material 103 may have a first thickness $T_1$ of between about 50 μm and about 1000 μm, such as about 100 μm.

Figure 1B:
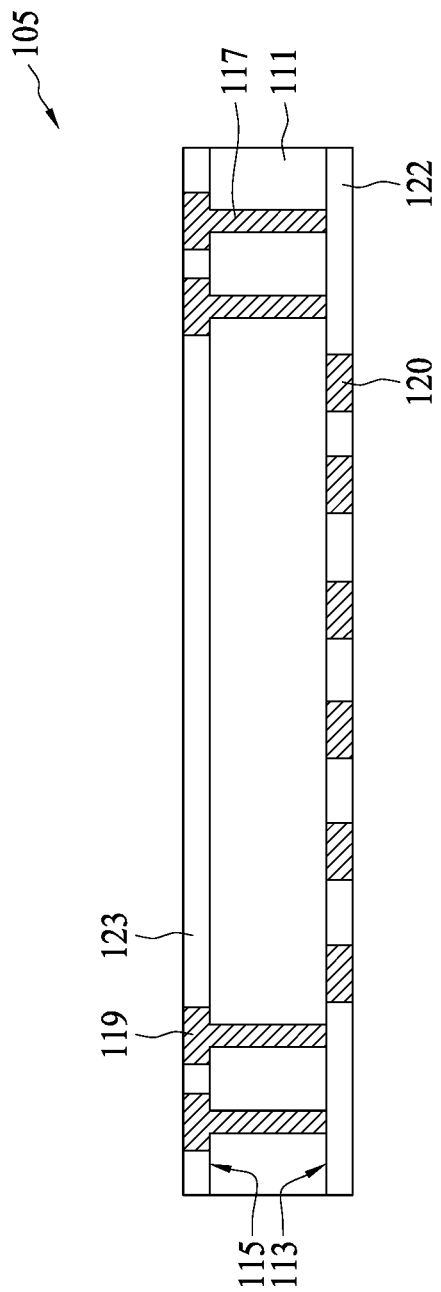

FIG. 1B illustrates a close up view of the sensor 105 that is placed in conjunction with sensor surface material 103 in FIG. 1A. In an embodiment the sensor 105 comprises a semiconductor substrate 111 with a face side 113 and a back side 115, an array of electrodes 120 located adjacent to the face side 113, and first through substrate vias (TSVs) 117 connecting the array of electrodes 120 from the face side 113 to the back side 115. In an embodiment the semiconductor substrate 111 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Additionally, while not separately illustrated in FIG. 1B, the sensor 105 may also comprise active devices and metallization layers in order to control and receive the input of signals from the array of electrodes 120 or else otherwise control the functionality and eventual output of the sensor 105. In an embodiment the active devices for the sensor 105 comprise a wide variety of active devices and passive devices such as capacitors, resistors, inductors and the like that may be used to generate the desired structural and functional requirements of the design for the sensor 105. The first active devices may be formed using any suitable methods either within or else on the semiconductor substrate 111.

The metallization layers are formed over the semiconductor substrate 111 and the active devices of the sensor 105 and are designed to connect the various active devices to form functional circuitry. In an embodiment the metallization layers are formed of alternating layers of dielectric and conductive material and may be formed through any suitable process (such as deposition, damascene, dual damascene, etc.). In an embodiment there may be four layers of metallization separated from the second semiconductor substrate by at least one interlayer dielectric layer (ILD), but the precise number of metallization layers is dependent upon the design of the sensor 105.

The array of electrodes 120 is electrically connected to the metallization layers of the sensor 105 and are used to measure the difference in capacitance between different areas of an overlying finger in order to measure the fingerprint. In an embodiment the array of electrodes 120 comprises a conductive material such as aluminum or copper, and is formed using, e.g., a deposition and patterning process whereby a blanket layer of conductive material is deposited using a process such as CVD, PVD, ALD, or the like, and the blanket layer of material is then patterned using a photolithographic masking and etching process. However, any suitable material or method of manufacture may be utilized to form the array of electrodes 120.

Once the array of electrodes 120 has been formed, a protective layer 122 is formed over the array of electrodes 120 in order to protect the array of electrodes 120 from defects caused by further processing or usage. In an embodiment the protective layer 122 may be a protective material such as polybenzoxazole (PBO) or polyimide (PI), silicon oxide, silicon nitride, silicon oxynitride, benzocyclobutene (BCB), or any other suitable protective material. The protective layer 122 may be formed using a method such as a spin-on process, a deposition process (e.g., chemical vapor deposition), or other suitable process based upon the chosen material, and may be formed to a thickness of between about 1 µm and about 100 µm, such as about 20 µm.

Additionally, while the formation of the array of electrodes 120 and the protective layer 122 has been described using a blanket deposition followed by a subsequent patterning and protection, this process is merely intended to be illustrative and is not intended to be limiting. Rather, any suitable process of manufacturing the array of electrodes 120, such as using a damascene or dual damascene process, may also be used. All such processes are fully intended to be included within the scope of the embodiments.

The first TSVs 117 are utilized to electrically connect the array of electrodes 120 and the metallization layers which are located on the face side 113 of the sensor 105 to the back side 115 of the sensor 105. The first TSVs 117 may be formed through the semiconductor substrate 111 prior to the sensor being adhered or bonded to the sensor surface material 103, and the process for forming them may start by initially applying and developing a suitable photoresist to the semiconductor substrate 111 prior to the formation of the metallization layers, and then etching the semiconductor substrate 111 to generate TSV openings. The openings for the first TSVs 117 at this stage may be formed so as to extend into the semiconductor substrate 111 to a depth at least greater than the eventual desired height of the finished semiconductor substrate 111.

Once the openings for the first TSVs 117 have been formed, the openings for the first TSVs 117 may be filled with, e.g., a barrier layer and a conductive material. The barrier layer may comprise a conductive material such as titanium nitride, although other materials, such as tantalum nitride, titanium, a dielectric, or the like may be utilized. The barrier layer may be formed using a CVD process, such as PECVD. However, other processes, such as sputtering or metal organic chemical vapor deposition (MOCVD), may be used. The barrier layer may be formed so as to contour to the underlying shape of the opening for the first TSVs 117.

The conductive material may comprise copper, although other suitable materials such as aluminum, alloys, doped polysilicon, combinations thereof, and the like, may be utilized. The conductive material may be formed by depositing a seed layer and then electroplating copper onto the seed layer, filling and overfilling the openings for the first TSVs 117. Once the openings for the first TSVs 117 have been filled, excess barrier layer and excess conductive material outside of the openings for the first TSVs 117 may be removed through a grinding process such as chemical mechanical polishing (CMP), although any suitable removal process may be used.

Once the conductive material is within the openings for the first TSVs 117, a thinning of the semiconductor substrate 111 may be performed in order to expose the openings for the first TSVs 117 and form the first TSVs 117 from the conductive material that extends through the semiconductor substrate 111. In an embodiment, the thinning of the semiconductor substrate 111 may be performed by a planarization process such as CMP or etching, leaving the first TSVs 117 planar with the semiconductor substrate 111.

However, as one of ordinary skill in the art will recognize, the above described process for forming the first TSVs 117 is merely one method of forming the first TSVs 117, and other methods are also fully intended to be included within the scope of the embodiments. For example, forming the openings for the first TSVs 117, filling the openings for the first TSVs 117 with a dielectric material, thinning the semiconductor substrate 111 to expose the dielectric material, removing the dielectric material, and filling the openings for the first TSVs 117 with a conductor may also be used. This and all other suitable methods for forming the first TSVs 117 into the semiconductor substrate 111 are fully intended to be included within the scope of the embodiments.

On the back side 115 of the sensor 105, and in electrical connection with the first TSVs 117, optional contact pads 119 are formed to provide an electrical connection to a subsequently formed first redistribution layer 131 (not illustrated in FIG. 1A or 1B but illustrated and described below with respect to FIG. 1C). In an embodiment the contact pads 119 are formed of a conductive material such as aluminum, although other suitable materials, such as copper, tungsten, or the like, may be utilized. The contact pads 119 may be formed using a process such as CVD or PVD, although other suitable materials and methods may be utilized. Once the material for the contact pads 119 has been deposited, the material may be shaped into the contact pads 119 using, e.g., a photolithographic masking and etching process.

Once the contact pads 119 have been formed, a first protective layer 123 may be placed and patterned. In an embodiment the first protective layer 123 may be a protective material such as polybenzoxazole (PBO) or polyimide (PI), silicon oxide, silicon nitride, silicon oxynitride, benzocyclobutene (BCB), or any other suitable protective material. The first protective layer 123 may be formed using a method such as a spin-on process, a deposition process (e.g., chemical vapor deposition), or other suitable process based upon the chosen material, and may be formed to a thickness of between about 1 μm and about 100 μm, such as about 20 μm.

Once formed the first protective layer 123 is patterned to form openings and expose the contact pads 119. In an embodiment the first protective layer 123 may be patterned using, e.g., a photolithographic masking and etching process. In such a process, a first photoresist (not individually illustrated in FIG. 1B) is applied to the first protective layer 123 and then exposed to a patterned light source. The light source will impinge upon the first photoresist and induce a change in a property of the first photoresist, which is then utilized to selectively remove either the exposed portion or the unexposed portion and expose the first protective layer 123. The first photoresist is then utilized as a mask during, e.g., an etching process which removes portions of the first protective layer 123 to expose the contact pads 119. Once the first protective layer 123 has been patterned, the first photoresist may be removed using, e.g., an ashing process.

In another embodiment the first protective layer 123 may be thinned in order to expose the contact pads 119. In this embodiment a planarization process such as a chemical mechanical polishing process, whereby chemicals and abrasives are applied to the first protective layer 123 while a polishing pad grinds away material, may be utilized to remove the material of the first protective layer 123 from over the contact pads 119, thereby exposing the contact pads 119 while also planarizing the first protective layer 123 with the contact pads 119.

Returning now to FIG. 1A, the sensor 105 may be placed onto and adhered to the sensor surface material 103 with the assistance of a first glue layer 127. In an embodiment the first glue layer 127 is a color film or adhesive glue, such as an epoxy resin, a phenol resin, acrylic rubber, silica filler, or a combination thereof, and is applied using a lamination or spin coating technique. However, any other suitable material and method of formation may be utilized. The first glue layer 127 may be applied to have a second thickness $T_2$ of between about 2 μm and about 20 μm, such as about 10 μm.

Once the first glue layer 127 has been applied to either the sensor 105 or to the sensor surface material 103, the sensor 105 may be adhered to the first glue layer 127 or the sensor surface material 103 using, e.g., a pick-and-place process, whereby the sensor 105 is aligned with the desired position and then lowered such that the first glue layer 127 is in contact with both the sensor 105 and the sensor surface material 103. Additionally, in an embodiment the sensor 105 may have a second width $W_2$ that is less than the first width $W_1$ (of the sensor surface material 103). For example, the sensor 105 may have the second width $W_2$ of between about 5 mm and about 10 mm, such as about 7 mm. The sensor 105 may also have a third thickness $T_3$ of between about 50 μm and about 250 μm, such as about 100 μm. However, any suitable width or other dimension may be used.

Once the sensor 105 has been placed and adhered onto the sensor surface material 103, the sensor 105 and the sensor surface material 103 are encapsulated with an encapsulant 125. In an embodiment the encapsulant 125 may be a molding compound and may be placed using a molding device (not illustrated in FIG. 1C). For example, the sensor surface material 103 and the sensor 105 may be placed within a cavity of the molding device, and the cavity may be hermetically sealed. The encapsulant 125 may be placed within the cavity either before the cavity is hermetically sealed or else may be injected into the cavity through an injection port. In an embodiment the encapsulant 125 may be a molding compound resin such as polyimide, PPS, PEEK, PES, a heat resistant crystal resin, combinations of these, or the like.

Once the encapsulant 125 has been placed into the cavity such that the encapsulant 125 encapsulates the region around the sensor surface material 103 and the sensor 105, the encapsulant 125 may be cured in order to harden the encapsulant 125 for optimum protection. While the exact curing process is dependent at least in part on the particular material chosen for the encapsulant 125, in an embodiment in which molding compound is chosen as the encapsulant 125, the curing could occur through a process such as heating the encapsulant 125 to between about 100° C. and about 130° C., such as about 125° C. for about 60 sec to about 3000 sec, such as about 600 sec. Additionally, initiators and/or catalysts may be included within the encapsulant 125 to better control the curing process.

However, as one having ordinary skill in the art will recognize, the curing process described above is merely an exemplary process and is not meant to limit the current embodiments. Other curing processes, such as irradiation or even allowing the encapsulant 125 to harden at ambient temperature, may be used. Any suitable curing process may be used, and all such processes are fully intended to be included within the scope of the embodiments discussed herein.

FIG. 1A additionally illustrates a thinning of the encapsulant 125 in order to expose the contact pads 119 of the sensor 105. In an embodiment the thinning may be performed, e.g., using a mechanical grinding or chemical mechanical polishing (CMP) process whereby chemical etchants and abrasives are utilized to react and grind away the encapsulant 125. The encapsulant 125 may be thinned until the contact pads 119 have been exposed.

However, while the CMP process described above is presented as one illustrative embodiment, it is not intended to be limiting to the embodiments. Any other suitable removal process may be used to encapsulate the sensor 105 while exposing the contact pads 119. For example, a chemical etch or a series of chemical etches may be utilized, or an encapsulation process that does not cover the contact pads 119 may be utilized. These processes and any other suitable process may be utilized to thin the encapsulant 125, and all such processes are fully intended to be included within the scope of the embodiments.

Figure 1C:
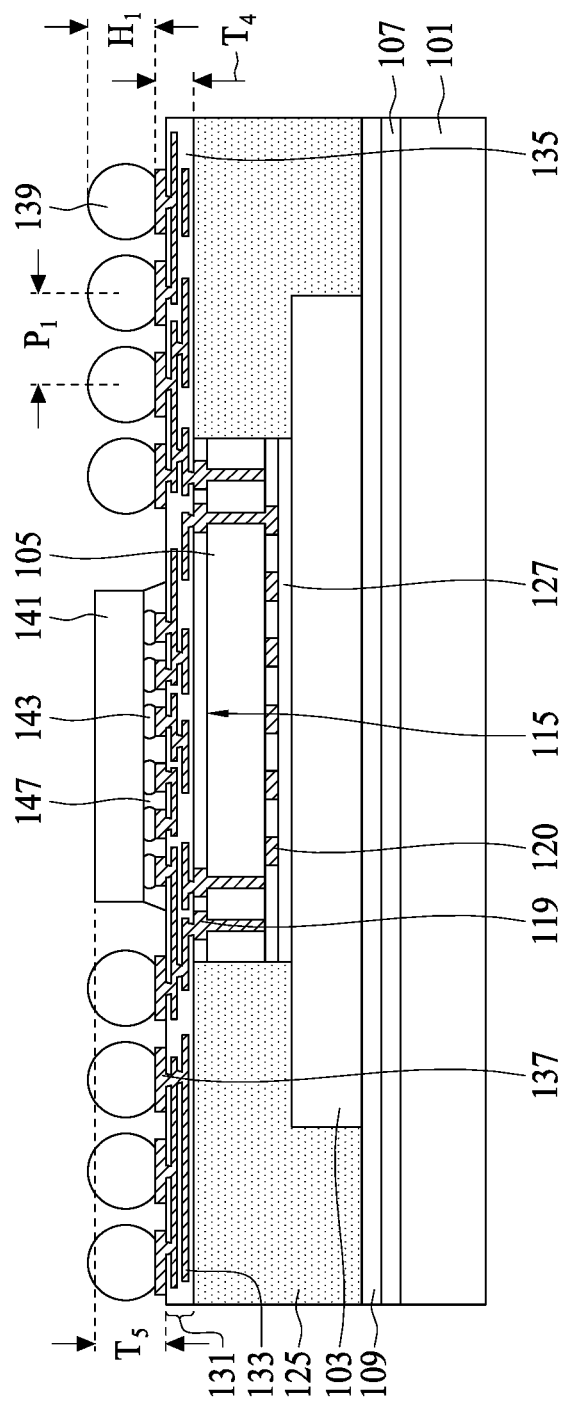

FIG. 1C illustrates a formation of first redistribution layers 131 over the back side 115 of the sensor 105 and the encapsulant 125. In an embodiment the first redistribution layers 131 comprises a series of conductive layers 133 (such as two conductive layers) embedded within a series of dielectric layer 135 (such as three dielectric layers). In an embodiment, a first one of the series of dielectric layer 135 is formed over the encapsulant 125 and the contact pads 119 in order to provide protection and isolation for the encapsulant 125 and the contact pads 119 and the other underlying structures. In an embodiment the first one of the series of dielectric layer 135 may be a material such as polybenzoxazole (PBO), although any suitable material, such as polyimide or a polyimide derivative, may be utilized. The first one of the series of dielectric layers 135 may be placed using, e.g., a spin-coating process, although any suitable method may be used.

After the first one of the series of dielectric layer 135 has been formed, openings may be made through the first one of the series of dielectric layers 135 by removing portions of the first one of the series of dielectric layers 135 to expose at least a portion of the contact pads 119 underlying the first one of the series of dielectric layer 135. The openings allow for contact between the contact pads 119 and the subsequently formed series of conductive layers 133. The openings may be formed using a suitable photolithographic mask and etching process, although any suitable process to expose the underlying contact pads 119 may be used.

In another embodiment in which the contact pads 119 are not formed in connection with the first TSVs 117, the first one of the series of dielectric layers 135 may be formed over the encapsulant 125 and directly over and in contact with the first TSVs 117. In this embodiment, rather than patterning the first one of the series of dielectric layers 135 to expose the contact pad 119 (because it is not present), the first one of the series of dielectric layers 135 are patterned to expose portions of the first TSVs 117. This and all other embodiments of electrically connecting the first TSVs 117 to the first redistribution layers 131 are fully intended to be included within the scope of the embodiments.

Once the first one of the series of dielectric layers 135 has been formed and patterned, a first one of the series of conductive layers 133 is formed over the first one of the series of dielectric layers 135 and through the openings formed within the first one of the series of dielectric layers 135 in order to make electrical connection with the first TSVs 117 (either directly or through intervening structures such as the optional contact pads 119). In an embodiment the first one of the series of conductive layers 133 may be formed by initially forming a seed layer (not shown) of a titanium copper alloy through a suitable formation process such as CVD or sputtering. A photoresist (also not shown) may then be formed to cover the seed layer, and the photoresist may then be patterned to expose those portions of the seed layer that are located where the first one of the series of conductive layers 133 is desired to be located.

Once the photoresist has been formed and patterned, a conductive material, such as copper, may be formed on the seed layer through a deposition process such as plating. The conductive material may be formed to have a thickness of between about 1 µm and about 10 µm, such as about 5 µm. However, while the material and methods discussed are suitable to form the conductive material, these materials are merely exemplary. Any other suitable materials, such as AlCu or Au, and any other suitable processes of formation, such as CVD or PVD, may be used to form the first one of the series of conductive layers 133. Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

Once the first one of the series of conductive layers 133 has been formed, a second one of the series of dielectric layers 135 and a second one of the series of conductive layers 133 may be formed by repeating steps similar to the first one of the series of dielectric layers 135 and the first one of the series of conductive layers 133. These steps may be repeated as desired in order to electrically connect each of the series of conductive layers 133 to an underlying one of the series of conductive layers 133, and may be repeated as often as desired until an uppermost one of the series of conductive layers 133 and an uppermost one of the series of dielectric layers 131 has been formed. In an embodiment the deposition and patterning of the series of conductive layers 133 and the series of dielectric layers 135 may be continued until the first redistribution layers 131 have a fourth thickness $T_4$ of between about 10 µm and about 50 µm, such as about 35 µm, although any suitable number of individual layers and any suitable thickness may be utilized.

Once the uppermost one of the series of conductive layers 133 has been covered by the uppermost one of the series of dielectric layers 135, and the uppermost one of the series of dielectric layers 135 has been patterned to expose a portion of the uppermost one of the series of dielectric layers 135, underbump metallization layers 137 may be formed through the uppermost one of the series of dielectric layers 135 to be in physical and/or electrical contact with a portion of the uppermost one of the series of conductive layers 133. In an embodiment the underbump metallization layers 137 may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the underbump metallization layers 137. Any suitable materials or layers of material that may be used for the underbump metallization layers 137 are fully intended to be included within the scope of the current application.

The underbump metallization layers 137 may be created by forming each layer over the uppermost one of the series of dielectric layers 135 and in electrical and/or physical contact with the uppermost one of the conductive layers 133. The forming of each layer may be performed using a plating process, such as electrochemical plating, although other processes of formation, such as sputtering, evaporation, or PECVD process, may be used depending upon the desired materials. The underbump metallization layers 137 may be formed to have a thickness of between about 0.7 µm and about 10 µm, such as about 5 µm. Once the desired layers have been formed, portions of the layers may then be removed through a suitable photolithographic masking and etching process to remove the undesired material and to leave the underbump metallization layers 137 in a desired shape, such as a circular, octagonal, square, or rectangular shape, although any desired shape may be formed.

Once the underbump metallization layers 137 have been formed, first external connections 139 may be utilized to provide an external connection point for electrical connection to the first redistribution layer 131 and may be, for example, a contact bump as part of a ball grid array (BGA), although any suitable connection may be utilized. In an embodiment in which the first external connections 139 are contact bumps, the first external connections 139 may comprise a material such as tin, or other suitable materials, such as silver, lead-free tin, or copper. In an embodiment in which the first external connections 139 are tin solder bumps, the first external connections 139 may be formed by initially forming a layer of tin through such commonly used methods such as evaporation, electroplating, printing, solder transfer, ball placement, etc., to a thickness of, e.g., about 250 µm. Once a layer of tin has been formed on the structure, a reflow may be performed in order to shape the material into the desired bump shape.

The first external connections 139 maybe formed to have a first pitch $P_1$ of between about 200 µm and about 600 µm, such as about 400 µm. Additionally, in an embodiment in which the first external connections 139 are solder balls, the first external connections 139 may have a first height $H_1$ after the reflow of between about 60 µm and about 250 µm, such as about 180 µm, and, once the first external connections 139 have been bonded to another device (e.g., a printed circuit board), the first external connections 139 may have a joint height of about 140 µm.

FIG. 1C additionally illustrates a placement and bonding of a high voltage chip 141 in electrical connection with the first redistribution layers 131 through the underbump metallization layers 137. In an embodiment the high voltage chip 141 is designed and connected in order to supply a high voltage, such as between about 5 V and about 50 V, such as about 33 V, to the sensor 105 in order to amplify the sensor's sensitivity. For example, by integrating the high voltage chip 141 with the sensor 105 such that a high voltage can be supplied to the sensor 105, the sensitivity of the sensor 105 may be increased ten times by raising the input voltage to 33 V from, e.g., 3.3 V.

In an embodiment the high voltage chip 141 may comprise a second semiconductor substrate (not separately illustrated), active devices (not separately illustrated), metallization layers (not separately illustrated) utilized to interconnect the active devices of the high voltage chip 141, and second external connections 143 in order to interconnect the high voltage chip 141 to the sensor 105. The second semiconductor substrate may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active devices comprise a wide variety of active devices and passive devices such as capacitors, resistors, inductors and the like that may be used to generate the desired structural and functional requirements of the design for the high voltage chip 141. The active devices may be formed using any suitable methods either within or else on the second semiconductor substrate.

The metallization layers are formed over the second semiconductor substrate and the active devices of the high voltage chip 141 and are designed to connect the various active devices to form functional circuitry. In an embodiment the metallization layers are formed of alternating layers of dielectric and conductive material and may be formed through any suitable process (such as deposition, damascene, dual damascene, etc.). In an embodiment there may be four layers of metallization separated from the second semiconductor substrate by at least one interlayer dielectric layer (ILD), but the precise number of metallization layers is dependent upon the design of the high voltage chip 141.

The second external connections 143 may be formed to interconnect the high voltage chip 141 to the sensor 105 and may be, for example, contact bumps, although any suitable connection may be utilized. In an embodiment in which the second external connections 143 are contact bumps, the second external connections 143 may comprise a material such as tin, or other suitable materials, such as silver, lead-free tin, or copper. In an embodiment in which the second external connections 143 are tin solder bumps, the second external connections 143 may be formed by initially forming a layer of tin through such commonly used methods such as evaporation, electroplating, printing, solder transfer, ball placement, etc., to a thickness of, e.g., about 100 µm. Once a layer of tin has been formed on the structure, a reflow may be performed in order to shape the material into the desired bump shape.

The high voltage chip 141 may be connected to the underbump metallization layers 137, for example, by initially applying a solder paste to the exposed underbump metallization layers 137 and then flip chip bonding the high voltage chip 141 to the underbump metallization layers 137. In an embodiment the high voltage chip 141 may be bonded by sequentially dipping the second external connections 143 of the high voltage chip 141 into flux, and then using a pick-and-place tool in order to physically align the second external connections 143 of the high voltage chip 141 with individual ones of the underbump metallization layers 137. In an embodiment in which the second external connections 143 are solder balls, once the high voltage chip 141 has been placed a reflow process may be performed in order to physically bond the high voltage chip 141 with the underlying underbump metallization layers 137 and a flux clean may be performed. However, any other suitable connector or connection process may be utilized, such as metal-to-metal bonding or the like.

In an embodiment the high voltage chip 141 is sized in order to sufficiently fit in conjunction with the first external connections 139. For example, in an embodiment in which the sensor 105 has an area of about 6.5×6.5 mm², the high voltage chip 141 may be formed as a square with an area of between about 4 mm² and about 16 mm², such as about 6 mm². Additionally, after the high voltage chip 141 has been bonded, the high voltage chip 141 may have a fifth thickness $T_5$ extending away from the first redistribution layer 131 of between about 100 µm and about 200 µm, such as about 125 µm. In a particular embodiment, the second external connections 143 may have a thickness of about 50 µm while the remainder of the high voltage chip 141 may have a thickness of about 75 µm. However, any suitable dimensions may be utilized for the high voltage chip 141.

Once the high voltage chip 141 has been bonded to the underbump metallization layers 137, an underfill material 147 may be placed between the high voltage chip 141 and the sensor 105 in order to help protect and isolate the devices. In an embodiment the underfill material 147 is a protective material used to cushion and support the high voltage chip 141 from operational and environmental degradation, such as stresses caused by the generation of heat during operation. The underfill material 147 may comprise, for example, a liquid epoxy or other protective material, and then cured to harden and may be dispensed by, e.g., injection.

Figure 1D:
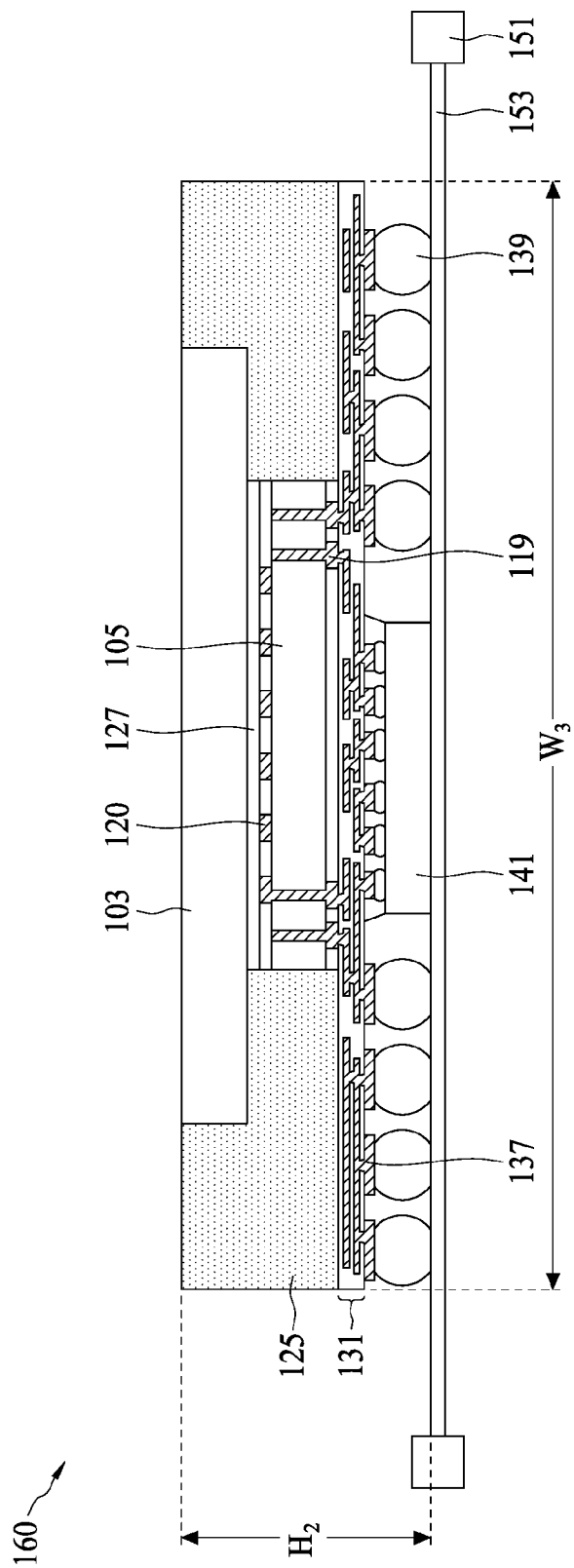

FIG. 1D illustrates a debonding of the carrier substrate 101 from the sensor surface material 103. In an embodiment the first external connections 139 and, hence, the structure including the sensor 105 and the sensor surface material 103, may be attached to a ring structure 151. The ring structure 151 may be a metal ring intended to provide support and stability for the structure during and after the debonding process. In an embodiment the first external connections 139 are attached to the ring structure using, e.g., a ultraviolet tape 153, although any other suitable adhesive or attachment may be used.

Once the first external connections 139 are attached to the ring structure 151, the carrier substrate 101 may be debonded from the structure using, e.g., a thermal process to alter the adhesive properties of the adhesive layer 109. In a particular embodiment an energy source such as an ultraviolet (UV) laser, a carbon dioxide ($CO_2$) laser, or an infrared (IR) laser, is utilized to irradiate and heat the adhesive layer 109 until the adhesive layer 109 loses at least some of its adhesive properties. Once performed, the carrier substrate 101 and the adhesive layer 109 may be physically separated and removed from the structure comprising the first external connections 139, the sensor 105, and the sensor surface material 103.

Once the carrier substrate 101 has been removed, the sensor surface material 103 and the sensor 105 may be separated from other devices formed using a single substrate to form a first sensor package 160. In an embodiment the singulation may be performed by using a saw blade (not shown) to slice through the encapsulant 125, thereby separating one section from another to form the first sensor package 160 with the sensor 105 and the sensor surface material 103. However, as one of ordinary skill in the art will recognize, utilizing a saw blade for the singulation process is merely one illustrative embodiment and is not intended to be limiting. Alternative methods for singulation, such as utilizing one or more etches to separate the first sensor package 160, may be utilized. These methods and any other suitable methods may be utilized to singulate the first sensor package 160.

In an embodiment the first sensor package 160 may be singulated such that the first sensor package 160 has a third width $W_3$ that is greater than the first width $W_1$ (of the sensor surface material 103) or the second width $W_2$ (of the sensor 105), such as having the third width $W_3$ of between about 5 mm and about 15 mm, such as about 12 mm. Additionally, the first sensor package 160 may be singulated to have a package area of between about 5*5 mm$^2$ and about 15*15 mm$^2$, such as about 7.6*7.6 mm$^2$. Additionally, after the removal of the carrier substrate 101, the first sensor package 160 may have a second height $H_2$ of between about 200 μm and about 800 μm, such as about 435 μm. In an embodiment in which the first sensor package 160 has the second height $H_2$, of 435 μm, the second height $H_2$ comprises the sensor surface material 103 being 100 μm, the first glue layer 127 being 10 μm, the sensor 105 being 100 μm, the first redistribution layer 131 being 35 μm, and the first external connections 139 being 190 μm. As such, the overall height of the first sensor package 160 may be reduced from about 1 mm to less than about 0.45 mm, such as about 0.435 mm, while also having a gap between the sensor 105 and the sensor surface material 103 of between about 10 and about 30 μm, such as about 10 μm (the thickness of the first glue layer 127).

By forming the first sensor package 160 as described above, a low cost, high performance system with a small form factor system in package (SIP) solution may be manufactured. Such a small form factor along with the small distance between the array of electrodes 120 and an overlying finger increases the sensitivity of the sensor 105. Such a package may be integrated into a user equipment such as cellular phones, personal digital assistants, tablet computers, or the like, including such cellular phones that utilize the IOS system.

Figure 1E:
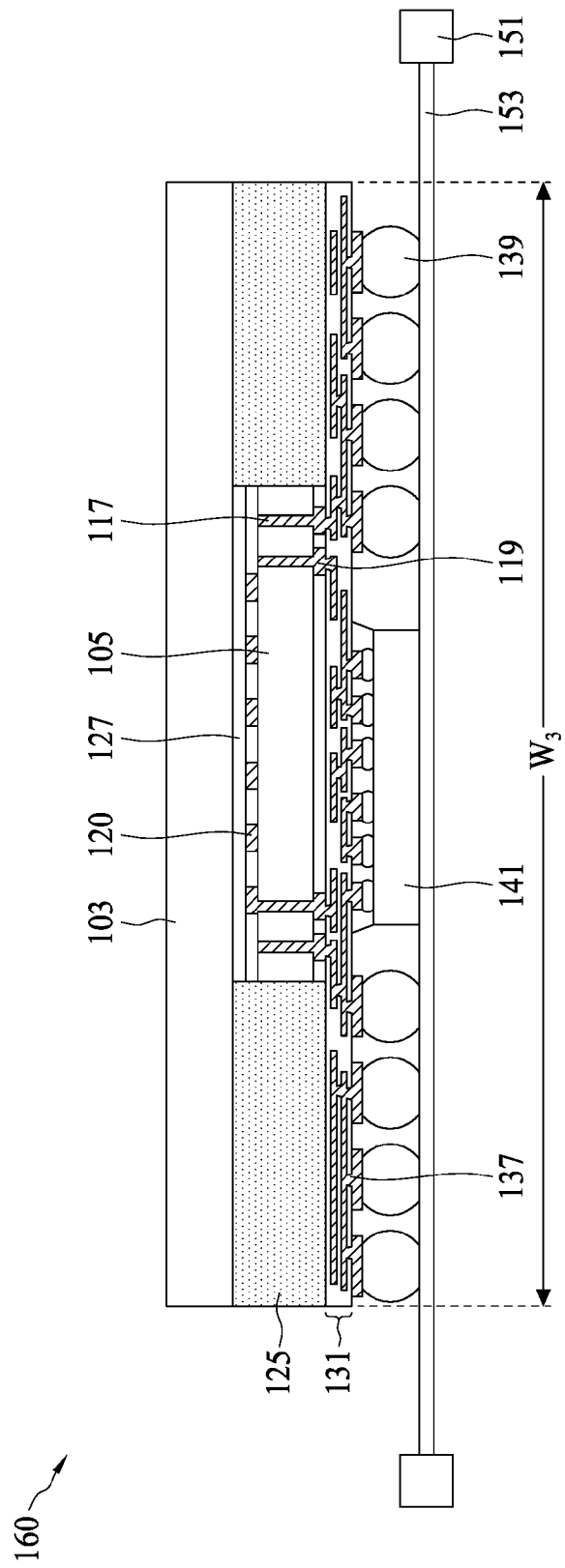

FIG. 1E illustrates another embodiment which uses the first TSVs 117 in order to help interconnect the array of electrodes 120. In this embodiment, however, instead of having the sensor surface material 103 have the first width $W_1$ which is less than the third width $W_3$ (the width of the first sensor package 160), the sensor surface material 103 has the third width $W_3$ as well. By having the sensor surface material 103 be the same width as the first sensor package 160, the sensor surface material 103 may extend the width of the first sensor package 160.

Figure 2A:
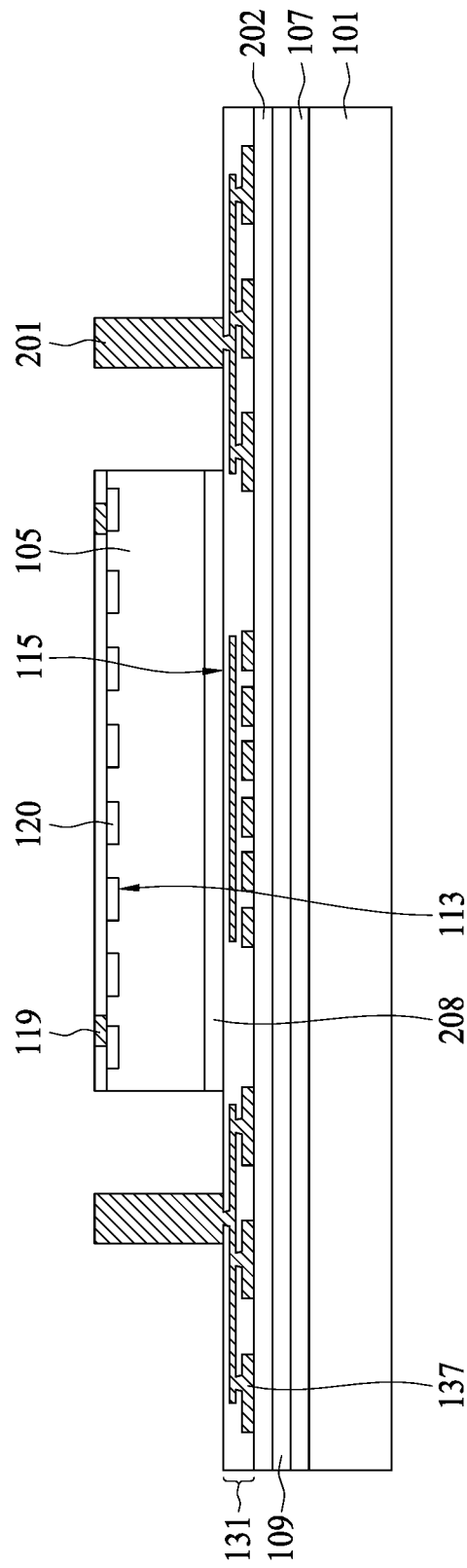
FIGS. 2A-2D illustrate an embodiment which uses through vias separated from the sensor in accordance with some embodiments.

FIG. 2A illustrates an embodiment which utilizes second TSVs 201 that are formed not within the sensor 105 (as described above with respect to FIGS. 1A-1E), but are formed laterally removed from the location of the sensor 105. In this embodiment, prior to placement of the sensor 105, a passivation layer 202 is initially formed over the adhesive layer 109. In an embodiment the passivation layer 202 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer 202 may be formed through a process such as chemical vapor deposition (CVD), although any suitable process may be utilized, and may have a thickness between about 0.5 μm and about 5 μm, such as about 9.25 KÅ

Once the passivation layer 202 has been formed, the underbump metallization layers 137 and the first redistribution layers 131 may be formed over the passivation layer 202. In an embodiment the underbump metallization layers 137 and the first redistribution layers 131 are formed as described above with respect to FIGS. 1A-1D, although they are formed in reverse order so that the underbump metallization layers 137 are formed between the carrier substrate 101 and the first redistribution layers 131. However, any suitable process, materials, or order of steps, may be utilized.

Once the underbump metallization layers 137 and the first redistribution layers 131 have been formed over the carrier substrate 101, the second TSVs 201 are formed in electrical connection with the first redistribution layers 131. In an embodiment the second TSVs 201 may be formed by initially forming a seed layer (not separately illustrated in FIG. 2A). In an embodiment the seed layer is a thin layer of a conductive material that aids in the formation of a thicker layer during subsequent processing steps. The seed layer may comprise a layer of titanium about 1,000 Å thick followed by a layer of copper about 5,000 Å thick. The seed layer may be created using processes such as sputtering, evaporation, or PECVD processes, depending upon the desired materials. The seed layer may be formed to have a thickness of between about 0.3 μm and about 1 μm, such as about 0.5 μm.

Once the seed layer has been formed, a photoresist (also not illustrated in FIG. 2A) is placed over the seed layer. In an embodiment the photoresist may be placed on the seed layer using, e.g., a spin coating technique to a height of between about 50 μm and about 250 μm, such as about 120 μm. Once in place, the photoresist may then be patterned by exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern. In an embodiment the pattern formed into the photoresist is a pattern for the second TSVs 201. The second TSVs 201 are formed in such a placement as to be located on different sides of subsequently attached devices such as the sensor 105. However, any suitable arrangement for the pattern of second TSVs 201 may be utilized.

In an embodiment the second TSVs 201 are formed within the photoresist. In an embodiment the second TSVs 201 comprise one or more conductive materials, such as copper, tungsten, other conductive metals, or the like, and may be formed, for example, by electroplating, electroless plating, or the like. In an embodiment, an electroplating process is used wherein the seed layer and the photoresist are submerged or immersed in an electroplating solution. The seed layer surface is electrically connected to the negative side of an external DC power supply such that the seed layer functions as the cathode in the electroplating process. A solid conductive anode, such as a copper anode, is also immersed in the solution and is attached to the positive side of the power supply. The atoms from the anode are dissolved into the solution, from which the cathode, e.g., the seed layer, acquires the dissolved atoms, thereby plating the exposed conductive areas of the seed layer within the opening of the photoresist.

Once the second TSVs 201 have been formed using the photoresist and the seed layer, the photoresist may be removed using a suitable removal process. In an embodiment, a plasma ashing process may be used to remove the photoresist, whereby the temperature of the photoresist may be increased until the photoresist experiences a thermal decomposition and may be removed. However, any other suitable process, such as a wet strip, may be utilized. The removal of the photoresist may expose the underlying portions of the seed layer.

Once exposed a removal of the exposed portions of the seed layer may be performed. In an embodiment the exposed portions of the seed layer (e.g., those portions that are not covered by the second TSVs 201) may be removed by, for example, a wet or dry etching process. For example, in a dry etching process reactants may be directed towards the seed layer using the second TSVs 201 as masks. In another embodiment, etchants may be sprayed or otherwise put into contact with the seed layer in order to remove the exposed portions of the seed layer. After the exposed portion of the seed layer has been etched away, a portion of the first redistribution layers 131 is exposed between the second TSVs 201.

Once the second TSVs 201 have been formed, the sensor 105 is placed on the first redistribution layer 131 between the second TSVs 201 using, e.g., a second adhesive layer 208. In an embodiment the second adhesive layer 208 may be a similar material and applied in a similar fashion as the adhesive layer 109, although any suitable material may be used. In this embodiment, however, the sensor 105 is placed face up such that the face side 113 is facing away from the carrier substrate 101. Additionally, because the sensor 105 is placed face up, the first TSVs 117 are not needed, and may be removed such that the contact pads 119 are connected to the array of electrodes 120 and the metallization layers of the sensor 105 on the face side 113 of the sensor 105.

In a particular embodiment, the array of electrodes 120 is formed over the face side 113 of the sensor 105, and, once the array of electrodes 120 is formed, the contact pads 119 are formed over and in electrical connection with the array of electrodes 120, for example, by being connected to the metallization layers of the sensor 105 instead of being connected to the first TSVs 117. However, any suitable method of forming both the array of electrodes 120 as well as the contact pads 119 over the face side 113 of the sensor 105 may be utilized, and all such methods are fully intended to be included in the scope of the embodiments.

Figure 2B:
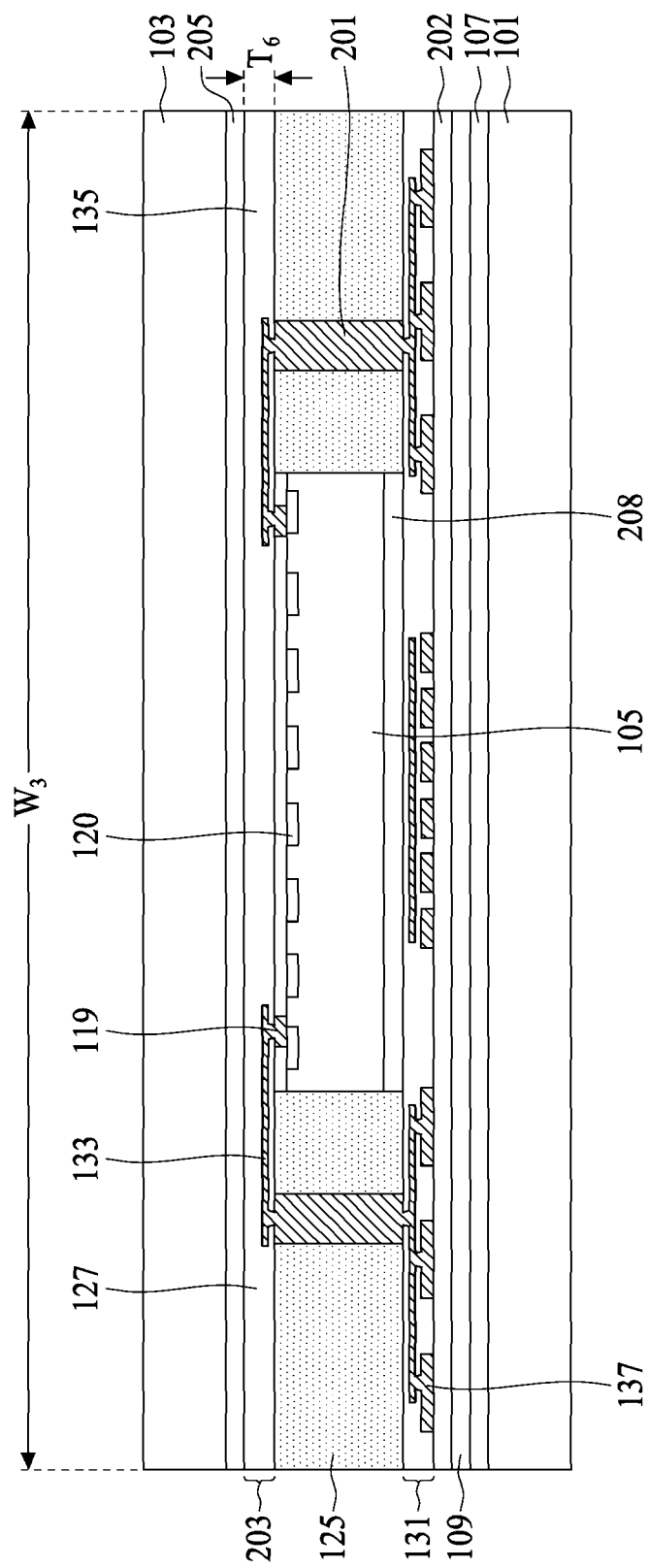

FIG. 2B illustrates an encapsulation of the sensor 105 and the second TSVs 201 with the encapsulant 125. In an embodiment the encapsulant 125 may be applied as described above with respect to FIG. 1A and, once applied, the encapsulant 125 may be thinned in order to expose the contact pads 119 of the sensor 105 as well as expose the second TSVs 201. However, any suitable encapsulant and method of application may be utilized.

In another embodiment the encapsulant 125 may be applied in an exposed molding process, wherein the sensor 105 is exposed directly after the molding process has been finished and without any extra thinning processes. In this embodiment there may be a height difference between the sensor 105 and the surface of the encapsulant 125. As such, a recessing process may be performed in order to form a planar surface for further processing.

FIG. 2B also illustrates a formation of a second redistribution layer 203 in order to electrically interconnect the second TSVs 201 with the contact pads 119 of the sensor 105. In an embodiment the second redistribution layer 203 may be similar to the first redistribution layer 131 described above with respect to FIG. 1C. In a particular embodiment, there may be a single one of the series of conductive layers 133 sandwiched between two of the series of dielectric layers 135. However, any suitable combination of conductive layers and dielectric layers may be utilized to interconnect the contact pads 119 of the sensor 105 with the second TSVs 201. In an embodiment the second redistribution layer 203 may be formed to have a sixth thickness $T_6$ of between about 10 μm and about 50 μm, such as about 17 μm, although any suitable thickness may be utilized.

Once the second redistribution layer 203 has been formed, the sensor surface material 103 may be attached to the second redistribution layer 203 using, e.g., a second glue layer 205. In an embodiment the sensor surface material 103 may be attached by initially applying the second glue layer 205 to the second redistribution layer 203 and then applying the sensor surface material 103 to the second glue layer 205. The second glue layer 205 may be similar to the first glue layer 127 described above with respect to FIG. 1A, although any suitable material may be used. Additionally, in this embodiment the sensor surface material 103 may be formed to have the third width $W_3$ (the width of the eventual package), although any suitable width may be utilized.

Figure 2C:
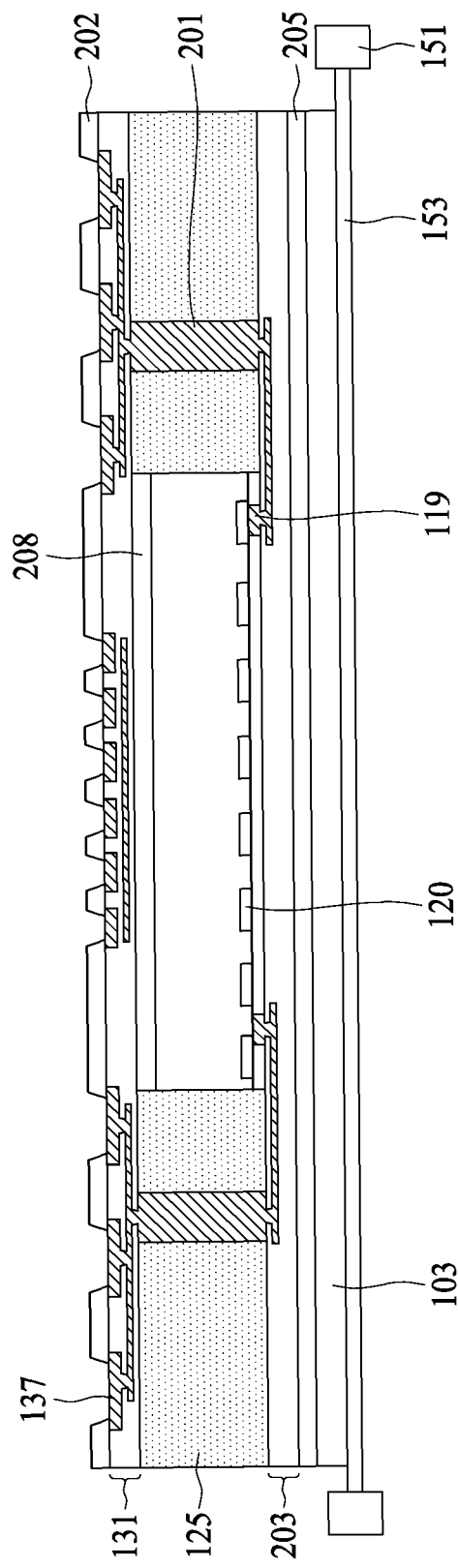

FIG. 2C illustrates a debonding of the carrier substrate 101 and a patterning of the passivation layer 202 in order to expose the underbump metallization layers 137. In an embodiment the carrier substrate 101 may be debonded by initially bonding the sensor surface material 103 to, e.g., the ring structure 151. Once attached, the carrier substrate 101 may be debonded from the structure using, e.g., a thermal process to alter the adhesive properties of the adhesive layer 109 as described above with respect to FIG. 1D, although any suitable method for debonding the carrier substrate 101 may be utilized.

Once debonded, the passivation layer 202 is patterned in order to expose the underlying underbump metallization layers 137. In an embodiment the passivation layer 202 may be patterned using, e.g., a laser drilling method. In such a method a protective layer, such as a light-to-heat conversion (LTHC) layer or a hogomax layer (not separately illustrated in FIG. 2C) is first deposited over the passivation layer 202. Once protected, a laser is directed towards those portions of the passivation layer 202 which are desired to be removed in order to expose the underlying underbump metallization layers 137. During the laser drilling process the drill energy may be in a range from 0.1 mJ to about 30 mJ, and a drill angle of about 0 degree (perpendicular to the passivation layer 202) to about 85 degrees to normal of the passivation layer 202. In an embodiment the patterning may be formed to form openings over the underbump metallization layers 137 to have a width of between about 100 µm and about 300 µm, such as about 200 µm.

In another embodiment, the passivation layer 202 may be patterned by initially applying a photoresist (not individually illustrated in FIG. 2C) to the passivation layer 202 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the passivation layer 202 are removed with, e.g., a dry etch process. However, any other suitable method for patterning the passivation layer 202 may be utilized.

Figure 2D:
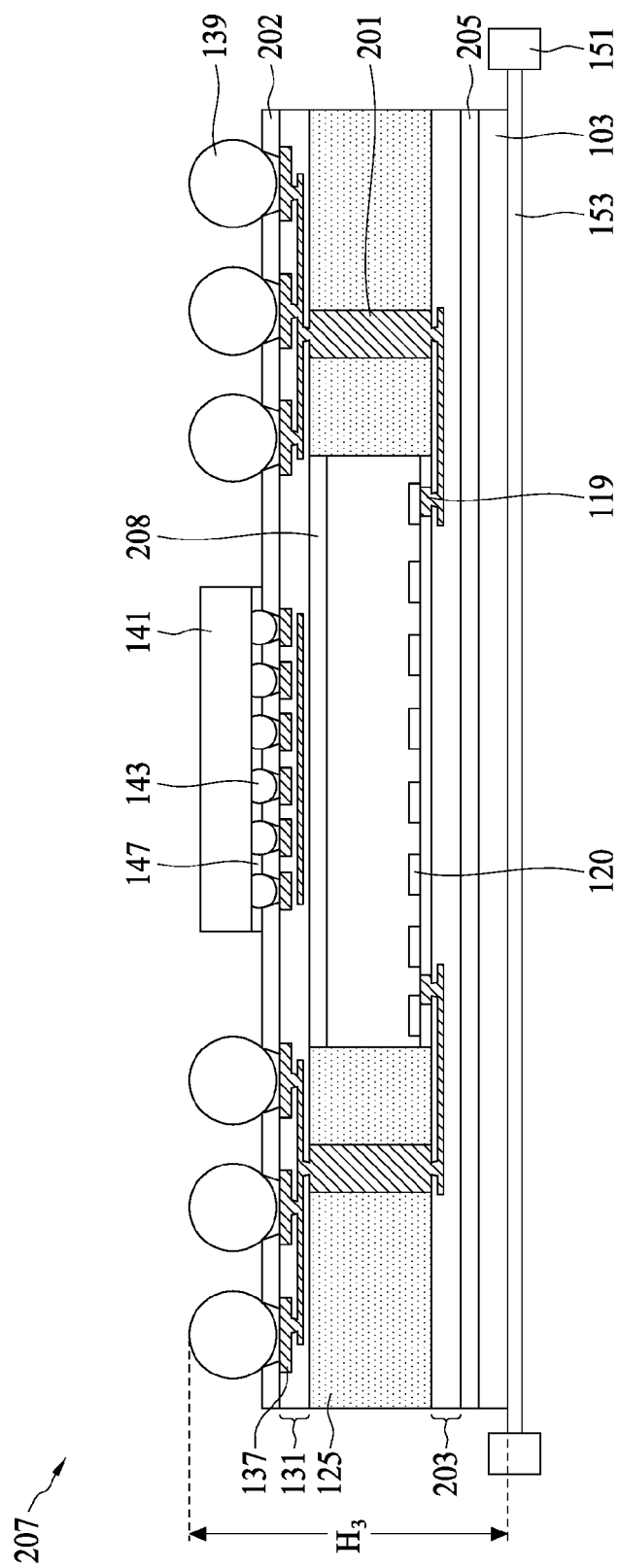

FIG. 2D illustrates that, once the passivation layer 202 has been patterned to expose the underbump metallization layers 137, the high voltage chip 141 may be bonded to the underbump metallization layers 137 through the passivation layer 202, the underfill material 147 may be placed, and the first external connections 139 may be placed in physical and/or electrical connection with the underbump metallization layers 137. In an embodiment the first external connections 139 may be placed and the high voltage chip 141 may be bonded as described above with respect to FIG. 1C. However, any suitable process may be utilized.

FIG. 2D additionally illustrates the singulation of the encapsulant 125 and the sensor surface material 103 to form a second sensor package 207. In an embodiment the singulation to form the second sensor package 207 may be performed as described above with respect to FIG. 1D. For example, a saw blade may be used to cut through the encapsulant 125 and the sensor surface material 103 to separate the second sensor package 207 from other sensor packages. However, any suitable method may be utilized.

In this embodiment the singulation process may be performed to form the second sensor package 207 to have an area of between about 5*5 mm² and about 15*15 mm², such as about 8.36*7.6 mm². Additionally, the second sensor package 207 with the second redistribution layer 203 may have a third height $H_3$ of between about 200 µm and about 800 µm, such as about 452 µm. In an embodiment in which the second sensor package 207 has the third height $H_3$, of 452 µm, the third height $H_3$ comprises the sensor surface material 103 being 100 µm, the second glue layer 205 being 10 µm, the second redistribution layer 203 being 17 µm, the sensor 105 being 100 µm, the first redistribution layer 131 being 35 µm, and the first external connections 139 being 190 µm. As such, the gap between the sensor 105 and the sensor surface material 103 may be between about 10 µm and about 30 µm, such as about 27 µm (the thickness of the second glue layer 205 and the layers of the second redistribution layer 203).

By manufacturing the second sensor package 207 as described above with respect to FIGS. 2A-2D, a low cost interconnect of the sensor 105 may be manufactured with the integrated fan out structure. Additionally, with the integration of the high voltage chip 141, the sensitivity of the sensor 105 can be increased while also reducing the overall thickness. Such a sensor package may be incorporated into similar cell phones, personal digital assistants, tablet computers, or the like, such as devices that operate using an Android operating system.

Figure 3A:
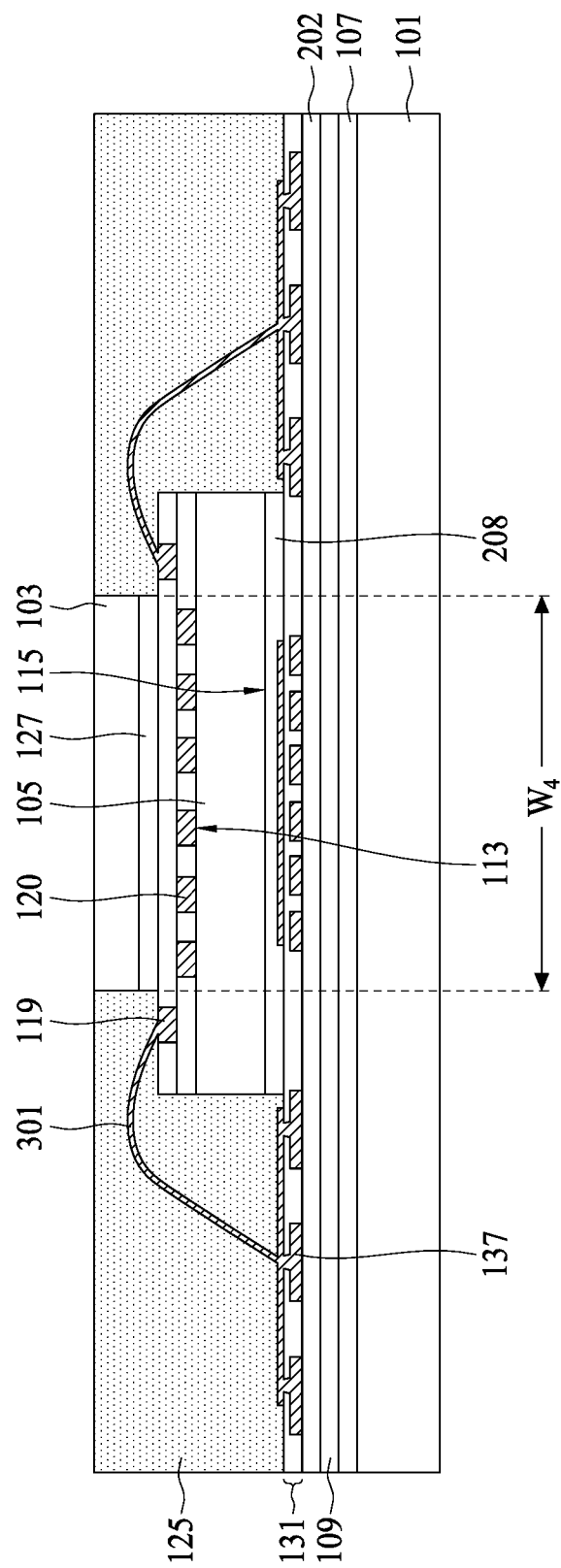
FIGS. 3A-3B illustrate an embodiment which uses wire bonds in accordance with some embodiments.

FIG. 3A illustrates another embodiment in which the sensor 105 is placed face up and in which the contact pads 119 are formed over the face side 113 of the sensor 105 similar to the embodiment described in FIGS. 2A-2D. In this embodiment, however, instead of using the second TSVs 201 to interconnect the contact pads 119 with the first redistribution layer 131, wire bonds 301 are utilized to interconnect the contact pads 119 with the first redistribution layer 131. In this embodiment, once the first redistribution layer 131 has been formed over the carrier substrate 101, the sensor 105 is attached to the first redistribution layer 131 without the formation of the second TSVs 201.

Additionally in this embodiment, the sensor surface material 103 has either already been attached to the sensor 105 or else is attached to the sensor 105 after the sensor 105 has been attached to the first redistribution layer 131. In an embodiment the sensor surface material 103 is attached using, e.g., the first glue layer 127, although any suitable method or material for adhering the sensor surface material 103 to the sensor 105 may be utilized. In this embodiment, so as not to cover the contact pads 119 of the sensor 105, the sensor surface material 103 may have a fourth width $W_4$ of between about 5 mm and about 10 mm, such as about 7 mm.

FIG. 3A also illustrates a formation of the wire bonds 301 between the contact pads 119 of the sensor 105 and the first redistribution layer 131. In an embodiment an electronic flame off (EFO) wand may be used to raise the temperature of a gold wire (not individually illustrated in FIG. 3A) within a capillary controlled by a wire clamp (also not individually illustrated in FIG. 3A). Once the temperature of the gold wire is raised to between about 150° C. and about 250° C., the gold wire is contacted to the contact pads 119 of the sensor 105 to form a first connection and then the gold wire is moved to the first redistribution layer 131 to form a second connection. Once connected, the remainder of the gold wire is separated from the connected portions to form the wire bonds 301. The connection process may be repeated to form as many connections as desired.

FIG. 3A additionally illustrates that, after the wire bonds 301 have been formed, the wire bonds 301, the sensor 105, and the sensor surface material 103 may be encapsulated with the encapsulant 125. In an embodiment the encapsulant 125 may be applied as described above with respect to FIG. 1A and, once applied, the encapsulant 125 may be thinned in order to expose the sensor surface material 103. In another embodiment the encapsulant 125 may be initially applied such that the encapsulant does not cover the sensor surface material 103. Any suitable encapsulant and method of application may be utilized.

Figure 3B:
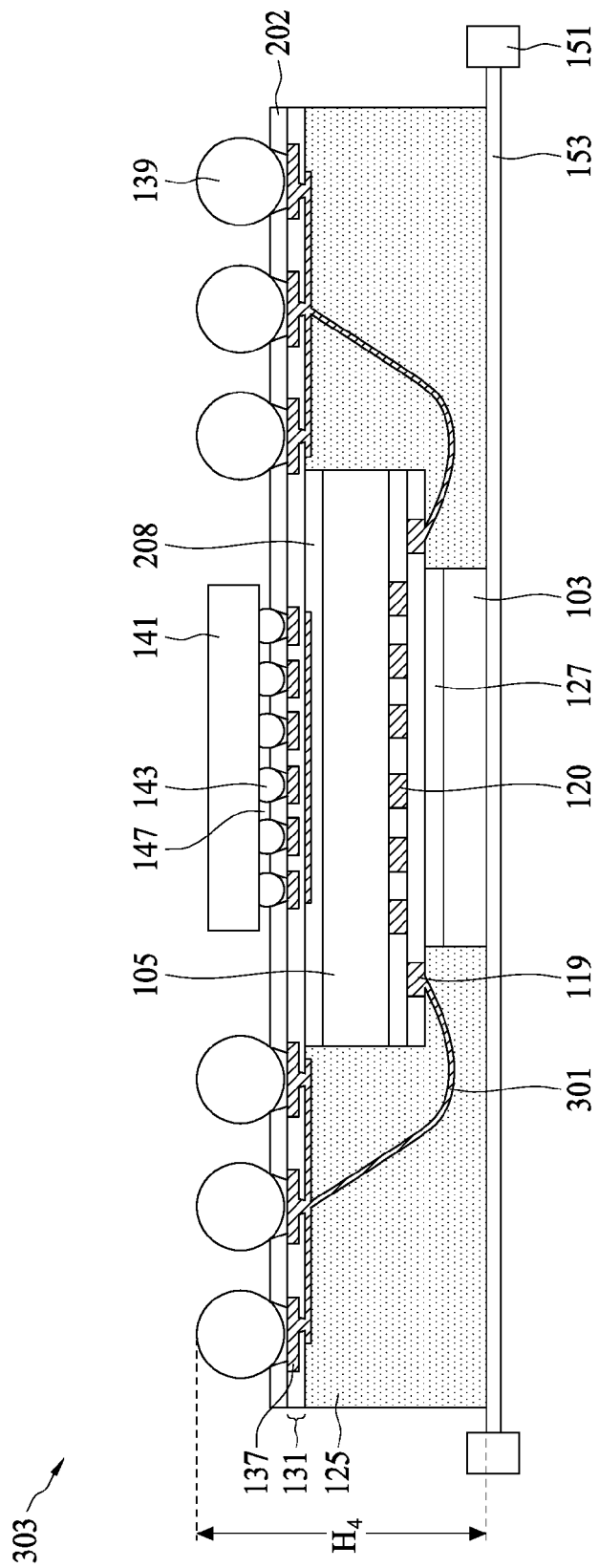

FIG. 3B illustrates a debonding of the carrier substrate 101, a patterning of the passivation layer 202 to expose the underbump metallization layer 137, a bonding of the high voltage chip 141, and a placement of the first external connections 139. In an embodiment the carrier substrate 101 may be debonded by initially bonding the sensor surface material 103 and the encapsulant 125 to, e.g., the ring structure 151. Once attached, the carrier substrate 101 may be debonded from the structure using, e.g., a thermal process to alter the adhesive properties of the adhesive layer 109 as described above with respect to FIGS. 1A-1D, although any suitable method for debonding the carrier substrate 101 may be utilized.

Once the carrier substrate 101 has been removed, the passivation layer 202 may be patterned, the high voltage chip 141 may be bonded, and the first external connections 139 may be placed. In an embodiment the passivation layer 202 may be patterned, the high voltage chip 141 may be bonded, and the first external connections 139 may be placed as described above with respect to FIGS. 2C-2D. However, any other suitable methods and materials may be utilized.

FIG. 3B additionally illustrates the singulation of the encapsulant 125 to form a third sensor package 303. In an embodiment the singulation to form the third sensor package 303 may be performed as described above with respect to FIG. 1D. For example, a saw blade may be used to cut through the encapsulant 125 and separate the third sensor package 303 from other sensor packages. However, any suitable method may be utilized.

By connecting the contact pads 119 to the first redistribution layer 131 through the wire bonds 301 (and without the second redistribution layer 203), the third sensor package 303 may be formed to have an area of between about 5*5 mm$^2$ and about 15*15 mm$^2$, such as about 8.5*7.6 mm$^2$. Additionally, the third sensor package 303 with the second redistribution layer 203 may have a fourth $H_4$ of between about 200 μm and about 800 μm, such as about 435 μm. In an embodiment in which the third sensor package 303 has the fourth height $H_4$ of 435 μm, the fourth height $H_4$ comprises the sensor surface material 103 being 100 μm, the first glue layer 127 being 10 μm, the sensor 105 being 100 μm, the first redistribution layer 131 being 35 μm, and the first external connections 139 being 190 μm. As such, the gap between the sensor 105 and the sensor surface material 103 may be between about 10 μm and about 30 μm, such as about 10 μm (the thickness of the first glue layer 127).

By manufacturing the third sensor package 303 as described above with respect to FIGS. 3A-3B, a low cost interconnect package for the sensor 105 may be manufactured with a smaller height with the use of the second TSVs 201. Additionally, with the integration of the high voltage chip 141, the sensitivity of the sensor 105 can be increased while also reducing the overall thickness. Such a sensor package may be incorporated into similar cell phones, personal digital assistants, tablet computers, or the like, such as devices that operate using an Android operating system.

FIGS. 4A-4D illustrate yet another embodiment in which connection blocks 401, such as silicon interposers, are utilized to connect the contact pads 119 of the sensor 105 to the first redistribution layer 131. In this embodiment the sensor 105 is initially placed onto the adhesive layer 109 over the carrier substrate 101. In this embodiment the sensor 105 is placed face up such that the face side 113 of the sensor 105 faces away from the carrier substrate 101. Additionally, with the sensor 105 being placed face-up, the array of electrodes 120 and the contact pads 119 of the sensor 105 face away from the carrier substrate 101 as well.

Additionally in this embodiment, rather than forming the second TSVs 201, connection blocks 401, such as silicon interposers, are attached to the adhesive layer 109 over the carrier substrate 101. In an embodiment the connection blocks 401 comprise a structural material, such as a semiconductor material or dielectric material that allows for the formation of a higher density of structures, such as through vias or integrated passive devices, to be formed therein. In particular embodiments the structural material comprises a material such as silicon, silicon dioxide, glass, combinations of these, or the like.

Within the connection blocks 401, third through substrate vias (TSVs) 403 may already be partially formed prior to the attachment of the sensor 105 to the adhesive layer 109. The third TSVs 403 may be formed through the structural material prior to the connection blocks 401 being adhered or bonded to the adhesive layer 109, and the process for forming them may start by initially applying and developing a suitable photoresist to the structural material, and then etching the structural material to generate third TSV openings. The openings for the third TSVs 403 at this stage may be formed so as to extend into the structural material to a depth at least greater than the eventual desired height of the finished connection block 401.

Once the openings for the third TSVs 403 have been formed, the openings for the third TSVs 403 may be filled with, e.g., a barrier layer and a conductive material. The barrier layer may comprise a conductive material such as titanium nitride, although other materials, such as tantalum nitride, titanium, a dielectric, or the like may be utilized. The barrier layer may be formed using a CVD process, such as PECVD. However, other processes, such as sputtering or metal organic chemical vapor deposition (MOCVD), may be used. The barrier layer may be formed so as to contour to the underlying shape of the opening for the third TSVs 403.

The conductive material may comprise copper, although other suitable materials such as aluminum, alloys, doped polysilicon, combinations thereof, and the like, may be utilized. The conductive material may be formed by depositing a seed layer and then electroplating copper onto the seed layer, filling and overfilling the openings for the third TSVs 403. Once the openings for the third TSVs 403 have been filled, excess barrier layer and excess conductive material outside of the openings for the third TSVs 403 may be removed through a grinding process such as chemical mechanical polishing (CMP), although any suitable removal process may be used.

Once the connection blocks 401 with the partially formed third TSVs 403 have been placed along with the sensor 105, the sensor 105 and the connection blocks 401 are encapsulated with the encapsulant 125. In an embodiment the encapsulant 125 may be applied as described above with respect to FIG. 1A and, once applied, the encapsulant 125 may be thinned in order to expose the contact pads 119 and the partially formed third TSVs 403. In another embodiment the encapsulant 125 may be initially applied such that the encapsulant 125 does not cover the contact pads 119 and the partially formed third TSVs 403. Any suitable encapsulant and method of application may be utilized.

Figure 4A:
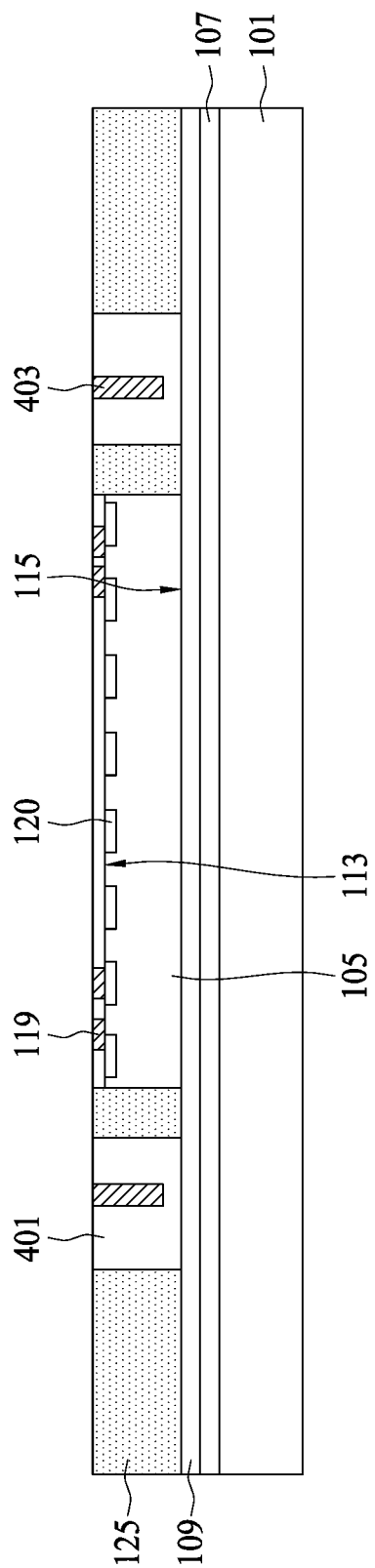
FIGS. 4A-4D illustrate an embodiment which utilizes connection blocks in accordance with some embodiments.
Figure 4B:
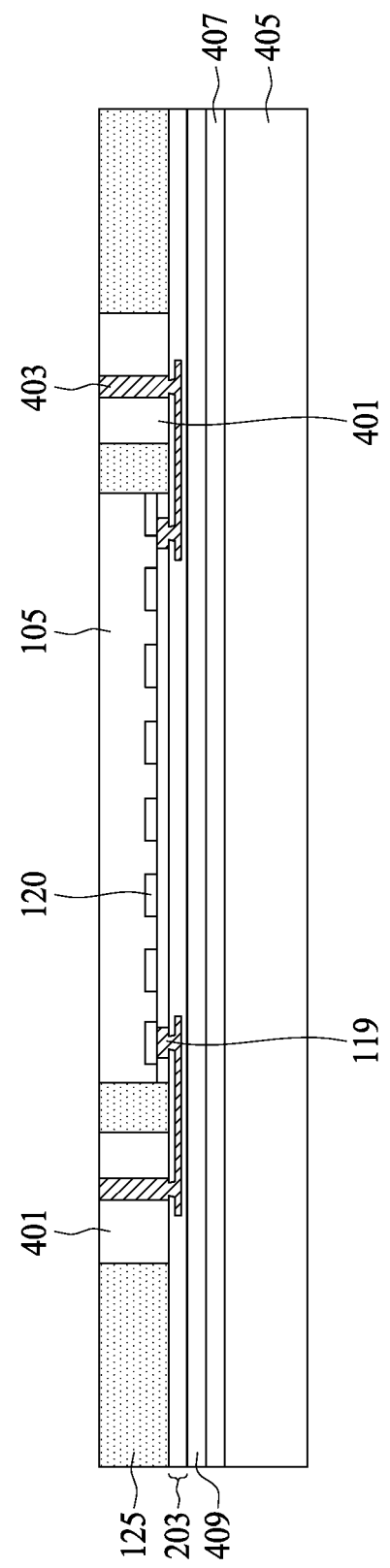

FIG. 4B illustrates that, once the encapsulation has been performed, the carrier substrate 101 may be removed. In an embodiment the carrier substrate 101 may be debonded as described above with respect to FIG. 1D. For example, a thermal process may be used to alter the adhesive properties of the adhesive layer 109, and the carrier substrate 101 may be physically removed.

Once the carrier substrate 101 has been removed, the second redistribution layer 203 may be formed in order to interconnect the contact pads 119 with the partially formed third TSVs 403. In an embodiment the second redistribution layer 203 may be formed without the presence of the carrier substrate 101 and prior to the bonding of the structure to another carrier. Additionally, the second redistribution layer 203 may be formed as described above with respect to FIG. 2B. For example, the second redistribution layer 203 in this embodiment may be formed with a first dielectric layer, a first conductive layer, and a second dielectric layer. However, any suitable number of layers or method of manufacture may be utilized.

Once the second redistribution layer 203 has been formed, the second redistribution layer 203 may be bonded to a second carrier substrate 405 using, e.g., a second protective layer 407 and a third adhesive layer 409. In an embodiment the second carrier substrate 405, the second protective layer 407, and the third adhesive layer 409 may be similar to the carrier substrate 101, the protective layer 107, and the adhesive layer 109 described above with respect to FIG. 1A, although they may also be different.

Once the second redistribution layer 203 has been bonded to the second carrier substrate 405, the thinning of the connection blocks 401 may be performed in order to expose the openings for the third TSVs 403 and form the third TSVs 403 from the conductive material that extends through the structural material of the connection blocks 401, as well as to remove any of the adhesive layer 109 (e.g., the DAF) that may remain. In an embodiment, the thinning of the connection blocks 401 may be performed by a planarization process such as CMP or etching, leaving the third TSVs 403 planar with the structural material of the connection blocks 401. Additionally, the same planarization process will also thin both the encapsulant 125 and the sensor 105, such that the sensor 105, the encapsulant 125, the structural material of the connection blocks 401, and the third TSVs 403 are planar with each other.

Figure 4C:
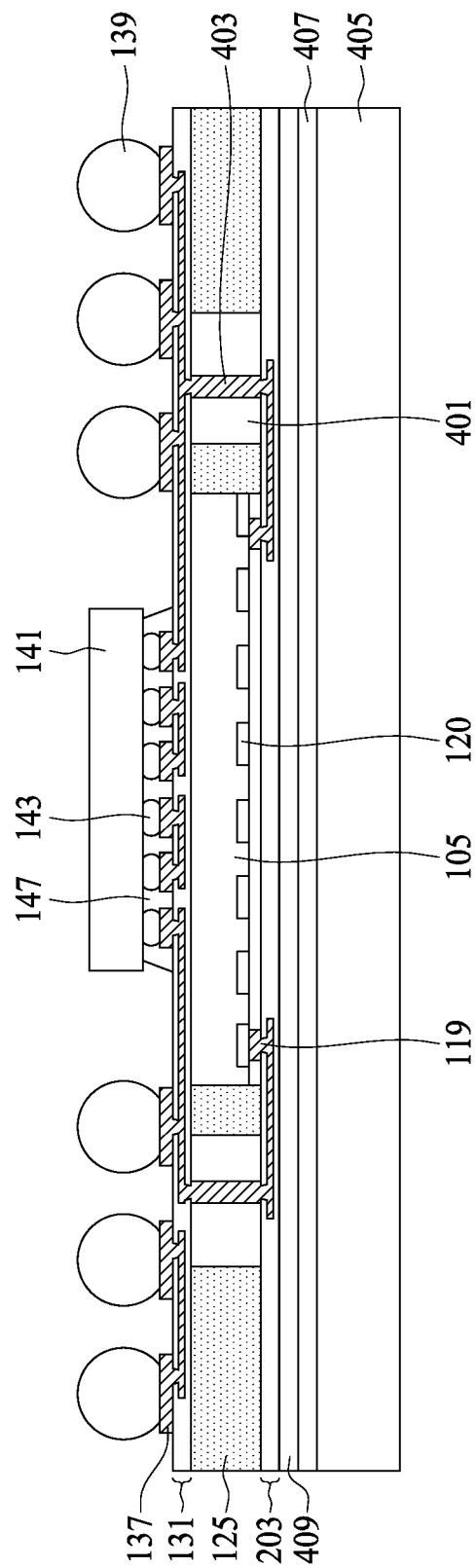

FIG. 4C illustrates that, after the connection blocks 401 have been thinned, the first redistribution layer 131 and the underbump metallization layers 137 may be formed in electrical connection with the now exposed third TSVs 403. In an embodiment the first redistribution layer 131 and the underbump metallization layers 137 may be formed as described above with respect to FIG. 1C, although any suitable materials and methods of manufacture may be utilized to form the first redistribution layer 131 and the underbump metallization layers 137.

FIG. 4C additionally illustrates that, once the underbump metallization layers 137 have been formed, the high voltage chip 141 may be bonded to the underbump metallization layers 137, the underfill material 147 may be placed, and the first external connections 139 may be placed in physical and/or electrical connection with the underbump metallization layers 137. In an embodiment the first external connections 139 may be placed and the high voltage chip 141 may be bonded as described above with respect to FIG. 1C. However, any suitable process may be utilized.

Figure 4D:
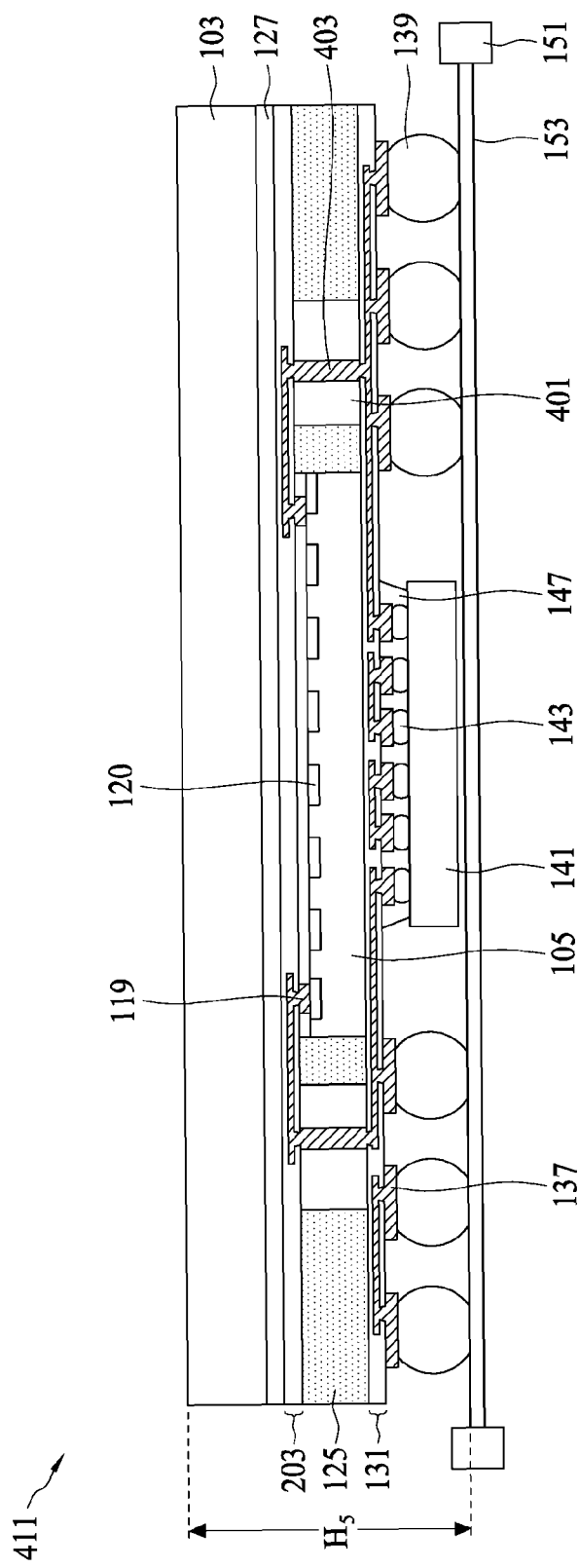

FIG. 4D illustrates a removal of the second carrier substrate 405 and a placement of the sensor surface material 103. In an embodiment the second carrier substrate 405 may be debonded by initially bonding the first external connections 139 to, e.g., the ring structure 151. Once attached, the second carrier substrate 405 may be debonded from the structure using, e.g., a thermal process to alter the adhesive properties of the third adhesive layer 409 as described above with respect to FIGS. 1A-1D, although any suitable method for debonding the second carrier substrate 405 may be utilized.

Once the second carrier substrate 401 has been removed to expose the second redistribution layer 203, the sensor surface material 103 may be adhered to the second redistribution layer 203. In an embodiment the sensor surface material 103 is attached using, e.g., the first glue layer 127. However, any suitable method or material for adhering the sensor surface material 103 to the second redistribution layer 203 may be utilized.

FIG. 4D additionally illustrates the singulation of the encapsulant 125 to form a fourth sensor package 411. In an embodiment the singulation to form the fourth sensor package 411 may be performed as described above with respect to FIG. 1D. For example, a saw blade may be used to cut through the encapsulant 125 and separate the fourth sensor package 411 from other sensor packages. However, any suitable method may be utilized.

By connecting the contact pads 119 to the first redistribution layer 131 through the third TSVs 403 within the connection blocks 401, the fourth sensor package 411 may be formed to have an area of between about 5*5 mm$^2$ and about 15*15 mm$^2$, such as about 8.6*7.6 mm$^2$. Additionally, the fourth sensor package 411 with the second redistribution layer 203 may have a fifth H$_5$ of between about 200 µm and about 800 µm, such as about 452 µm. In an embodiment in which the fourth sensor package 411 has the fifth height H$_5$ of 452 µm, the fifth height H$_5$ comprises the sensor surface material 103 being 100 µm, the first glue layer 127 being 10 µm, the second redistribution layer 203 being 17 µm, the sensor 105 being 100 µm, the first redistribution layer 131 being 35 µm, and the first external connections 139 being 190 µm. As such, the gap between the sensor 105 and the sensor surface material 103 may be between about 10 µm and about 30 µm, such as about 27 µm (the thickness of the first glue layer 127 and the layers of the second redistribution layer 203).

By manufacturing the fourth sensor package 411 as described above with respect to FIGS. 4A-4D, a low cost interconnect package for the sensor 105 may be manufactured with a larger density of interconnections. Additionally, with the integration of the high voltage chip 141, the sensitivity of the sensor 105 can be increased while also reducing the overall thickness. Such a sensor package may be incorporated into similar cell phones, personal digital assistants, tablet computers, or the like, such as devices that operate using an Android operating system.

In accordance with an embodiment, a method of manufacturing a fingerprint scanner comprising adhering a sensor to a sensor surface material, wherein the sensor comprises through substrate vias, is provided. The sensor and the sensor surface material are encapsulated with an encapsulant. A redistribution layer is formed on a surface of the sensor and in electrical connection with the through substrate vias, the surface facing away from the sensor surface material, and a high voltage die is attached in electrical connection with the redistribution layer.

In accordance with another embodiment, a method of manufacturing a fingerprint scanner comprising electrically connecting a contact pad to a conductive region of a first redistribution layer, wherein the contact pad is located on a first surface of a sensor, wherein the conductive region of the first redistribution layer is laterally separated from the sensor is provided. A sensor surface material is attached over the contact pad, and a high-voltage chip is connected to the first redistribution layer.

In accordance with yet another embodiment, a semiconductor device comprising a sensor comprising a semiconductor substrate and conductive vias extending through the semiconductor substrate is provided. A sensor surface material is attached to the sensor and a redistribution layer is electrically connected to the conductive vias and located on an opposite side of the sensor than the sensor surface material. A high voltage die is electrically connected to the redistribution layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a fingerprint scanner, the method comprising:
    adhering a sensor to a sensor surface material, wherein the sensor comprises through substrate vias;
    encapsulating the sensor and the sensor surface material with an encapsulant;
    forming a redistribution layer on a surface of the sensor and in electrical connection with the through substrate vias, the surface facing away from the sensor surface material; and
    attaching a high voltage die in electrical connection with the redistribution layer.

2. The method of claim 1, wherein the attaching the high voltage die attaches the high voltage die on an opposite side of the redistribution layer than the sensor.

3. The method of claim 1, further comprising singulating the encapsulant in order to form a first sensor package.

4. The method of claim 3, wherein the first sensor package has a first width, the sensor surface material has a second width less than the first width, and the sensor has a third width less than the second width.

5. The method of claim 1, wherein the forming the redistribution layer further comprises forming a conductive region in physical contact with the through substrate vias.

6. The method of claim 1, further comprising forming contact pads in electrical connection with the through substrate vias, wherein the forming the redistribution layer further comprises forming a conductive region in physical contact with the contact pads.

7. A method of manufacturing a fingerprint scanner, the method comprising:
    electrically connecting a contact pad to a conductive region of a first redistribution layer, wherein the contact pad is located on a first surface of a sensor, wherein the conductive region of the first redistribution layer is laterally separated from the sensor;
    attaching a sensor surface material over the contact pad; and
    connecting a high-voltage chip to the first redistribution layer.

8. The method of claim 7, further comprising:
    forming a through via on the first redistribution layer; and
    after the forming the through via, adhering the sensor to the first redistribution layer.

9. The method of claim 8, wherein the electrically connecting the contact pad to the conductive region further comprises forming a second redistribution layer to electrically connect the through via to the contact pad.

10. The method of claim 7, wherein the electrically connecting the contact pad to the conductive region further comprises forming a wire bond to electrically connect the through via to the contact pad.

11. The method of claim 10, further comprising encapsulating the sensor and the wire bond.

12. The method of claim 7, further comprising forming the first redistribution layer over a protective layer and underbump metallizations prior to electrically connecting the contact pad to the conductive region.

13. The method of claim 12, further comprising patterning the protective layer to expose the underbump metallizations.

14. The method of claim 7, further comprising:
    placing a substrate onto the first redistribution layer, the substrate comprising conductive vias; and
    thinning the substrate and the sensor to expose the conductive vias.

15. A semiconductor device comprising:
    a sensor comprising a semiconductor substrate and conductive vias extending through the semiconductor substrate;
    a sensor surface material attached to the sensor;
    a redistribution layer electrically connected to the conductive vias and located on an opposite side of the sensor than the sensor surface material; and
    a high voltage die electrically connected to the redistribution layer.

16. The semiconductor device of claim 15, wherein the sensor has a first width and the sensor surface material has a second width greater than the first width.

17. The semiconductor device of claim 16, wherein the sensor and the sensor surface material are part of a first package with a third width, the third width being larger than second width.

18. The semiconductor device of claim 16, wherein the sensor and the sensor surface material are part of a first package with the second width.

19. The semiconductor device of claim 15, wherein the redistribution layer is electrically connected to the conductive vias through contact pads.

20. The semiconductor device of claim 15, wherein the redistribution layer is in physical contact with the conductive vias.

* * * * *